United States Patent [19]
Grallert

[11] Patent Number: 4,540,973
[45] Date of Patent: Sep. 10, 1985

[54] QUANTIZER FOR A DPCM ENCODER

[75] Inventor: Hans-Joachim Grallert, Groebenzell, Fed. Rep. of Germany

[73] Assignee: Siemens Aktiengesellschaft, Berlin and Munich, Fed. Rep. of Germany

[21] Appl. No.: 580,035

[22] Filed: Feb. 14, 1984

[30] Foreign Application Priority Data

Feb. 23, 1983 [DE] Fed. Rep. of Germany ....... 3306334

[51] Int. Cl.³ .............................................. H03K 13/01
[52] U.S. Cl. ............................... 340/347 DD; 375/25
[58] Field of Search ..................................... 375/25–34; 364/724; 340/347 DD

[56] References Cited

U.S. PATENT DOCUMENTS 4,437,087 3/1984 Petr .............................. 340/347 DD

FOREIGN PATENT DOCUMENTS 2076240 11/1981 United Kingdom .................. 375/25

Primary Examiner—Bernard Roskoski
Attorney, Agent, or Firm—Karl F. Milde, Jr.

[57] ABSTRACT

A difference pulse code modulation ("DPCM") encoder for encoding and compressing digital data. This encoder includes a quantizer formed by a read-only memory (ROM). DPCM signal values to be quantized are supplied without a sign bit as addresses to the ROM; the code words read-out as data from the ROM in response to addresses represent the quantized DPCM signal values. The size of the ROM required for this purpose is reduced by limiting the DPCM signal values which are supplied as addresses to the ROM. The sign bit contained in the DPCM signal values is not supplied to the ROM but is added to the code words read-out of the ROM as quantized DPCM signal values. In addition, the DPCM signal values and also the code words read out of the ROM are rounded off by omission of the least significant bit.

10 Claims, 5 Drawing Figures

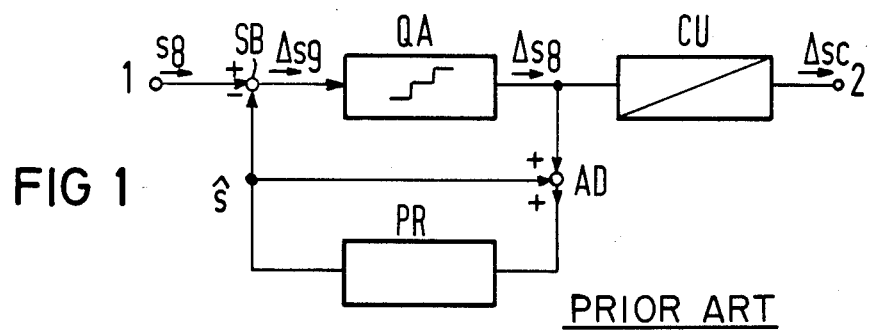
FIG 1
PRIOR ART
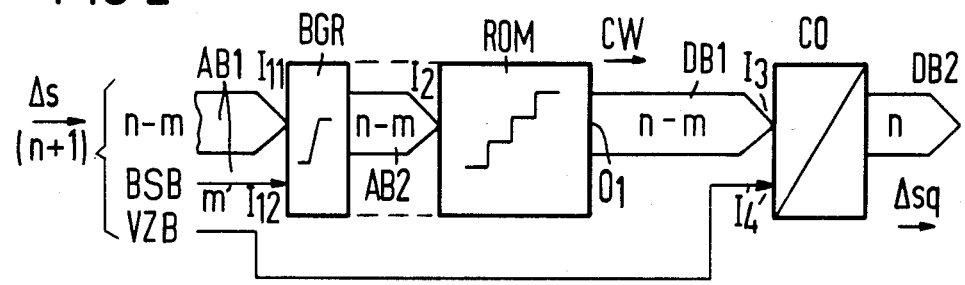
FIG 2
FIG 4
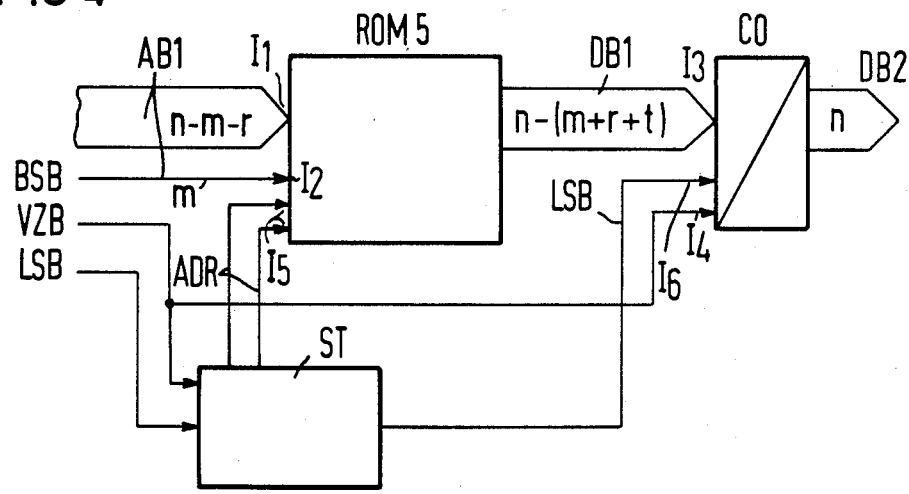

QUANTIZER FOR A DPCM ENCODER

BACKGROUND OF THE INVENTION

The present invention relates to a quantizer for a so-called difference pulse code modulation ("DPCM") encoder having a read-only memory ("ROM"). In a quantizer of this type, the raw DPCM signal values are supplied to the address input of the ROM and quantized DPCM signal values are read out from the data output of the ROM as code words.

Difference pulse code modulation ("DPCM") encoders are used for encoding and compressing digital data; i.e., for data reduction. The quantizer in a DPCM encoder assigns a single output code word to a number of different data words presented at its input. The individual code words forming the quantized DPCM signal values are then supplied at the output of the DPCM encoder, usually after another code conversion.

The quantizer may be constructed, for example, as a hard-wired logic gate circuit. However, a read-only memory (ROM) may also be used. In the latter case, an extremely large memory space must be provided since each possible input value of the quantizer represents a distinct address for the ROM.

SUMMARY OF THE INVENTION

It is the object of the present invention to provide a quantizer of the type described above—i.e., a quantizer in the form of a ROM—which requires very little memory space.

This object, as well as other objects which will become apparent from the discussion that follows, are achieved, according to the present invention, by connecting a limiter between the input of the DPCM encoder and the address input of the quantizer ROM for limiting the signal values supplied to the ROM to within a prescribed range. In addition, the sign bit of each DPCM signal value is not applied to the ROM as an address but is simply combined with the respective code word read out of the ROM to form the quantized DPCM signal value.

Merely by the fact that the sign bit of each DPCM signal value is not supplied to the quantizer, the requirement for memory space in the ROM is cut in half. Further memory space reduction is effected by limiting the addresses to a maximum value. If the maximum value is limited to one half of the total address space provided by the input DPCM signal values, the number of code words required to be stored in the ROM is also cut in half. And since the code words stored in the ROM must cover only a smaller range of values, it is possible to reduce the size of each code word by one or more bits. The range limitation of the input addresses to a maximum value generally has no disadvantages since a DPCM encoder is normally used in circuits which process band limited signals.

Advantageously, at least the least significant bit (LSB) of each input DPCM signal value is not supplied to the limiter, thereby reducing the required addressable volume of the ROM still further. By omitting the least significant bit or even several least significant bits, the address range is again cut in half for each omitted bit. By skillful selection of the quantization ranges, the accuracy of the quantizer may be preserved.

As a further feature of the present invention, the least significant bit or several least significant bits of each quantized DPCM signal value is not stored in the ROM; rather, the code words read out of the ROM are completed by the addition of low order bits.

By rounding off the quantized DPCM signal values (code words) the memory space requirement can be reduced still further. In this case, of course, there is an associated degradation in the quantization accuracy. If the quantization limits are favorable, however, the least significant bits can be replaced by constant values.

The forgoing as well as other objects, features and advantages of the invention will become apparent from the following, more particular description of the preferred embodiments of the invention, as illustrated in the accompanying drawings.

BRIEF DESCRIPTION OF THE DRAWINGS

FIG. 1 is a block diagram of a DPCM encoder of the type known in the prior art.

FIG. 2 is a block diagram of a quantizer according to the invention for use in a DPCM encoder.

FIG. 4 is a block diagram of a switchable quantizer according to the present invention which is realized with a single read-only memory.

DESCRIPTION OF THE PREFERRED EMBODIMENTS

Figure 3:
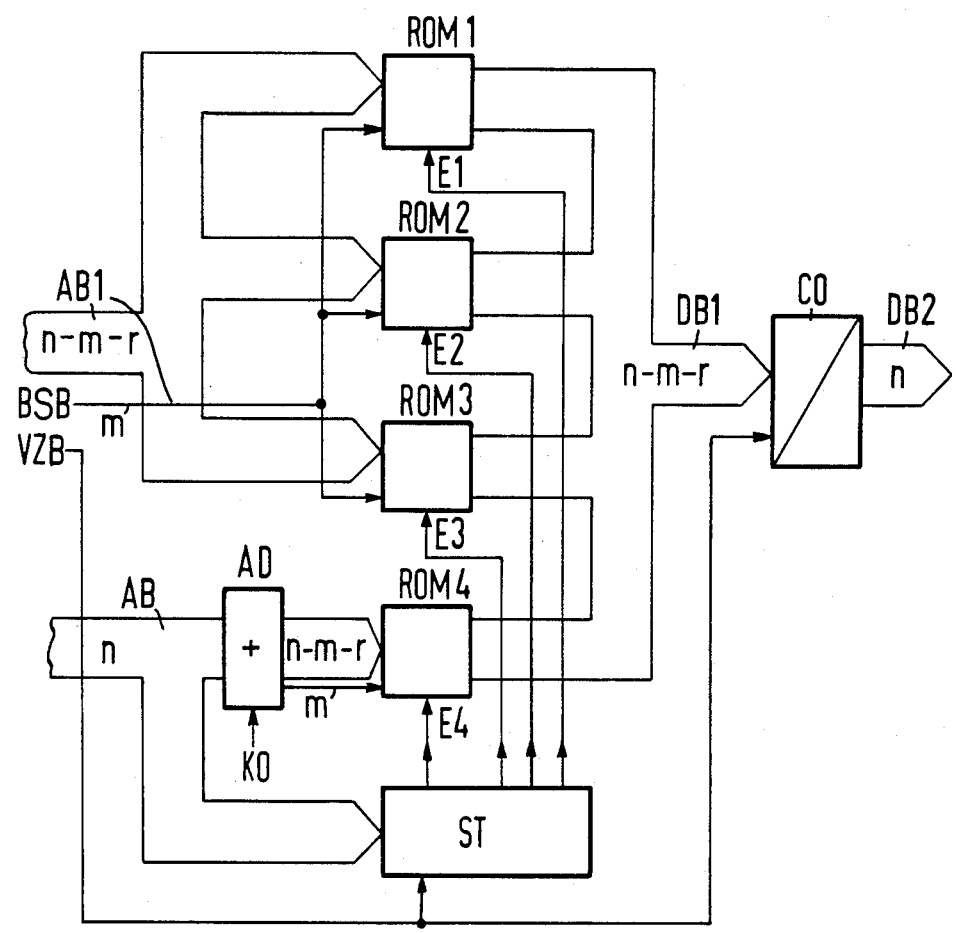
FIG. 3 is a block diagram of a switchable quantizer according to the present invention for use in a DPCM encoder.

FIG. 1 shows the basic circuit of a "DPCM encoder". Digital (e.g., 8 bit) sampling values are supplied in parallel to the input 1 of this DPCM encoder. The input 1 is connected to a the positive input of a subtractor SB; the other, negative input receives a signal S from a predictor PR. The output of the subtractor SB is connected to the address input of a quantizer QA. The data output of the quantizer QA is connected to the input of a code converter CU having an output 2. In addition, the output of the quantizer QA is connected to the first input of an adder AD. The output of the adder is connected to the input of the predictor PR. In the simplest case, the predictor PR operates to multiply the digital number applied to its input by a constant factor. The output of the predictor PR, which carries the signal S, is connected to the second input of the adder AD and with the negative input of the subtractor SB.

A DPCM encoder converts a sequence of (e.g., 8-bit) sampling values $S_8$ into a sequence of (e.g., 8-bit) quantized DPCM signal values $\Delta S_8$, which are determined from a respective calculated estimate S and the sample value. It is the function of the quantizer QA to assign a single output value to a range of input values which are applied to it as addresses.

For example, only 16 different output values $\Delta S_8$ may be assigned to 512 addresses. In this example, it is assumed that quantized digital signals 8 bits wide are read out of the ROM. In this case, the most significant bit represents the sign. By coupling the estimate S with an actual sample $S_8$, a 9 bit word width may result. These 9 bits $\Delta S_9$ are supplied to the read-only memory as an address. The memory space requirement in this simple quantizer is thus already $2^9 \times 8$ bits. Instead of a read-only memory, other types of memory may be used. For larger or switchable quantizers having several possible quantization values for each input DPCM signal value, the storage requirement is again increased considerably. The code converter CU following the read-only memory converts the possible output combinations of the memory—for example 16 of them—into code words 4 bits wide (ΔSC). The code converter itself can be realized either as a logic circuit or as a read-only memory.

FIG. 2 illustrates a quantizer according to the invention for use in a DPCM encoder of the type shown in FIG. 1. It contains a read-only memory ROM, whose address bus is marked AB2 and its data bus DB1. The address input is marked $I_2$, the data output $O_1$.

The read-only memory ROM is preceded by a limiter BGR which receives the numerical value of each DPCM signal values ΔS via its address bus AB1. The limiter BGR passes the received signal from its input to its output when the signal is within a prescribed, limited range. The limiter holds its output signal at an upper maximum value when the input signal is above this range. This output signal is thus delivered, as a limited address, to the read-only memory ROM via the address bus AB2. The address bus AB1 comprises n bits, although a total of n+1 bits are supplied to the quantizer. The sign bit VZB is conducted past the limiter BGR and past the read-only memory ROM to an input $I_4$ of a coder CO, whose input $I_3$ is connected with the data bus DB1. The quantizer difference signals ΔSQ are presented by the encoder CO as an output via another, n-bit data bus DB2.

In the drawings, the address bus AB1 is divided into a lower-order part, connected to a first input $I_{11}$ of limiter BGR, and a higher-order part BSB, connected to a second input $I_{12}$ of limiter BGR. This division is intended to symbolize the limitation to $2^{(n-m)}$ addresses.

Within a DPCM encoder the two's complement code is often used because of its advantages in addition and subtraction. This code is illustrated in the following table for n=8.

TABLE

|  | VZB | BSB | LSB | Encoder output |
|---|---|---|---|---|
| −255 | 1 | 0 | 000 000 1 |  |
| . | . | . | . |  |
| . | . | . | . |  |
| . | . | . | . |  |
| −127 | 1 | 1 | 000 000 1 | 1111 |
| −126 | 1 | 1 | 000 001 0 | 1110 |
| −125 | 1 | 1 | 000 001 1 | 1110 |
| . | . | . | . | . |
| . | . | . | . | . |
| . | . | . | . | . |
| −1 | 1 | 1 | 111 111 1 | 1000 |
| 0 | 0 | 0 | 000 000 0 | 0000 |
| +1 | 0 | 0 | 000 000 1 | 0000 |
| +2 | 0 | 0 | 000 001 0 | 0000 |
| +3 | 0 | 0 | 000 001 1 | 0000 |
| +4 | 0 | 0 | 000 010 0 | 0001 |
| . | . | . | . | . |
| . | . | . | . | . |
| . | . | . | . | . |
| +7 | 0 | 0 | 000 011 1 | 0001 |
| +8 | 0 | 0 | 000 100 0 | 0001 |
| . | . | . | . | . |
| . | . | . | . | . |
| . | . | . | . | . |
| +127 | 0 | 0 | 111 111 1 | 0111 |
| +128 | 0 | 1 | 000 000 0 |  |
| . | . | . | . |  |
| . | . | . | . |  |
| . | . | . | . |  |
| +255 | 0 | 1 | 111 111 1 |  |
|  |  |  | n |  |

This two's complement code must not be supplied to the read-only memory ROM as an address, however. Rather, the same address combination—for example, a binary coding of the values 0 to 255—must apply for both positive and equal negative values. In this example, it is assumed that the binary coded addresses (DPCM signal values) are supplied to the limiter BGR.

Upon combination with the sign bit, the range of values are doubled for the words CW read-out of the read-only memory ROM. As addresses, only n-m bits are supplied to the read-only memory. The remaining m most significant bits are not used to increase the number of ROM addresses. Taking as a basis n=8, for example, the limiter will limit the addresses, and produce a constant maximum output address, upon receipt of DPCM signal values in excess of 127. In this case, the most significant bit BSB after the sign bit VZB always assumes the logic state "1" for DPCM signal values in a range of 128 to 255. That is, if the most significant bit BSB is a logical "1" or if all lower-order bits are set to a logical "1", the limiter will present, at its output, the numerical value 127 as the highest read-only memory address.

Figure 5:
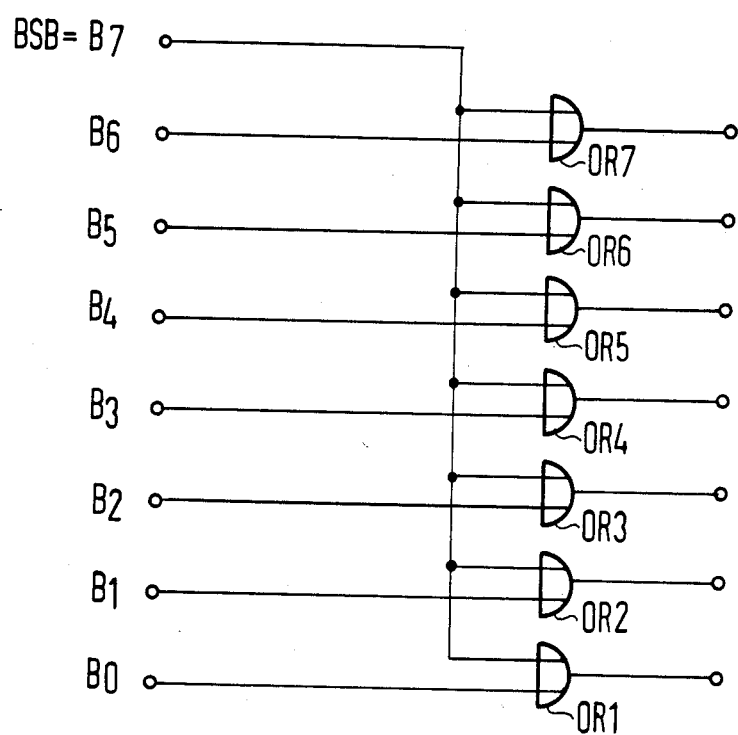
FIG. 5 is a limiter according to the present invention.

A limiter of this type is extremely simple in construction as is shown in FIG. 5. It comprises seven OR gates (OR1 to OR7), which pass the address bits $B_0$ to $B_6$, respectively. The most significant bit (BSB=$B_7$) is applied to all second inputs of the OR gates and sets all OR gate outputs to a logical "1" state as soon as the threshold of 127 is exceeded. Such a limiter presupposes the use of a signed code in which negative numbers differ from positive numbers of equal value only by the sign bit. It will be understood that it is within the skill of the art to construct other types of limiters, such as a limiter for the two's complement code.

As is indicated in FIG. 2 by dashed lines, the limiter BGR may be appropriately integrated into the read-only memory ROM. The limitation of the address to a maximum value not only reduces the number of code words which must be stored in the read-only memory, but also reduces the number of bits which are needed to represent the code words corresponding to these fewer address values. The width of the data bus DB1 may therefore by reduced accordingly.

The coder CO serves to restore the sign bit again to the code words read-out of the read-only memory ROM. In addition, the coder can effect a conversion to the two's complement code. Finally, the coder may add lower-order bits to the higher-order bits read-out of the read-only memory so that the output data bus DB2 will have the proper width in for the DPCM loop.

FIG. 3 illustrates a switchable quantizer. This quantizer comprises four read-only memories ROM1 to ROM4, three of which are connected together on their input side via the address bus AB1. The tri-state outputs on their output side are connected to a common data bus DB1. The address bus AB1 comprises m bus lines for the most significant bit(s) BSB and n-m-r bus lines for the lower-order bits. Activation or ROM selection inputs E1 to E4 permit selection of one of the read-only memories ROM1 to ROM4 by means of a control unit ST. The provision of the various read-only memories makes possible the selection of different quantization characteristics stored in each memory. This selection is preferably effected automatically by the control unit ST, for example by continuously monitoring the read addresses so as to check the amplitudes of the received DPCM signal values. However, the control unit ST may merely consist of a number of toggle switches for manual selection of the read-only memory.

It is desirable, for example, to select the quantization characteristic as a function of the difference between successive signal amplitudes. In this case, the control unit would essentially comprise a subtractor which receives the successive signal values. The amount of the difference between each two successive values—determined in general by the most significant bits—then determines the quantization.

The address inputs of the fourth memory ROM4 are preceeded by an adder AD. The data bus DB1 and the line carrying the sign bit VZB are connected to the coder CO.

It is possible to reduce the required memory space in the read-only memories by rounding off the DPCM signal values ΔS applied as addresses, for example by omission of the least significant bit or of r least significant bits. The data bus AB1 thus comprises n-m-r bus lines.

Complete DPCM signal values ΔS including both most significant bits BSB and least significant bits is applied to the adder AD via the data bus AB. A constant value KO is added to the DPCM signal values to form the address. From the output of the adder AD, the same number of bits are supplied to the address input of the fourth memory ROM4 as are applied to the other read-only memories.

The addition performed in the adder AD serves to shift the limits of the limited quantization range notwithstanding the fact that the address values are rounded off.

The coder CO serves to complement the data received on the data bus DB1 plus the sign bit with additional bits to present data on the output data bus DB2 of the required width.

In FIG. 4 is shown the realization of a switchable quantizer with only one read-only memory ROM5. The representation is essentially the same as for the quantizer of FIG. 3. However, the read-only memory ROM5 comprises an additional input I5, through which the control ST intervenes. This takes place through two address control lines ADR, permitting selection of one of four different address regions of the read-only memory. In addition, the read-out code words are rounded off by omission of t least significant bits so that a read-out code word comprises n−(m+r+t) bits (m=number of most significant bits not used for addressing, r=number of bits saved by rounding off the address, and t=number of bits saved by rounding off the read-out code words).

For the further calculations in the DPCM loop, the read-out code words are enlarged to the necessary number of bits again by adding the t least significant bits LSB. The t least significant bits can be either fixed logic values or they can be varied according to the selected quantizations by the control unit.

A short exemplary calculation will illustrate the possible saving in memory space once more: Originally, for example, $2^9 \times 8$ bits of memory space were necessary as explained above. By omission of the sign and limitation of the maximum address to 127 instead of the original ±255, only $2^7 \times 7$ bits must be stored. By rounding off the address by only one bit and by rounding off the read-out code words by one bit, the read-only memory space may be reduced to $2^6 \times 6$ bits. In this example, that means a reduction of the storage space to about 1/10 of the original storage space requirement.

There has thus been shown and described a novel quantizer for a DPCM encoder which fulfills all the objects and advantages sought therefor. Many changes, modifications, variations and other uses and applications of the subject invention will, however, become apparent to those skilled in the art after considering this specification and the accompanying drawings which disclose preferred embodiments thereof. All such changes, modifications, variations and other uses and applications which do not depart from the spirit and scope of the invention are deemed to be covered by the invention which is limited only by the claims which follow.

What is claimed is:

1. A digital data quantizer for a difference pulse code modulation ("DPCM") encoder comprising, in combination:
   (a) quantizer input means for receiving DPCM signals having numerical value ("NV") bits and a sign bit;
   (b) limiter means, connected to receive said NV bits from said quantizer input means, for producing a first digital output signal of constant value when the numerical value of the NV bits received exceeds an upper limit, and second digital output signals of variable value when the numerical value of the NV bits received falls below said upper limit, the values of said second output signals being dependent upon said numerical values;
   (c) read-only memory means having an address input and a data output, said address input being connected to receive the output signals of said limiter means for producing, at said data output, quantized DPCM digital signal values in response to the receipt of said output signals; and
   (d) quantizer output means, connected to said data output of said read-only memory means for receiving said quantized DPCM signal values, and connected to said quantizer input means for receiving said sign bit.

2. The quantizer according to claim 1, wherein the least significant bit of said NV bits is not supplied to said limiter means thereby reducing the required address space of said read-only memory means.

3. The quantizer according to claim 1, further comprising means for supplying a least significant bit to said output means which is not stored in, and received from said read-only memory means.

4. The quantizer according to claim 1, wherein said limiter means is integrated into, and forms of part of said read-only memory means.

5. The quantizer according to claim 1, wherein said read-only memory means comprises a plurality of separate read-only memories having separate address inputs selectively connected to receive the output signals of said limiter means, said read-only memories each having different quantization characteristics stored therein; and further comprising control means for selecting a particular read-only memory.

6. The quantizer according to claim 5, wherein said plurality of read-only memories are realized by a single, large, read-only memory circuit having a separately addressable storage area for each separate read-only memory.

7. The quantizer according to claim 1, further comprising adder means connected between said quantizer input means and said limiter means, for adding a digital number of constant value to said NV bits before said NV bits are applied to said limiter means.

8. The quantizer according to claim 1, wherein said data output, as well as said address input of said read-only memory means are each 6-bits wide due to omission of the least significant bit.

9. The quantizer according to claim 1, further comprising coder means, connected between said read-only memory means and said quantizer output means for receiving said quantized DPCM signal values and said sign bit and for converting the digital value received into a two's complement code.

10. The quantizer according to claim 1, wherein the entire circuit arrangement is implemented as an integrated circuit.

* * * * *